(12) United States Patent
Zhang et al.

(10) Patent No.: US 12,336,233 B2
(45) Date of Patent: Jun. 17, 2025

(54) GaN-BASED SEMICONDUCTOR DEVICE WITH REDUCED LEAKAGE CURRENT AND METHOD FOR MANUFACTURING THE SAME

(71) Applicant: INNOSCIENCE (SUZHOU) SEMICONDUCTOR CO., LTD., Suzhou (CN)

(72) Inventors: Xiao Zhang, Suzhou (CN); Lijie Zhang, Suzhou (CN); Jue Ouyang, Suzhou (CN); Wen-Yuan Hsieh, Suzhou (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/920,033

(22) PCT Filed: Jan. 25, 2022

(86) PCT No.: PCT/CN2022/073701
§ 371 (c)(1),
(2) Date: Oct. 20, 2022

(87) PCT Pub. No.: WO2023/141749
PCT Pub. Date: Aug. 3, 2023

(65) Prior Publication Data
US 2024/0222423 A1 Jul. 4, 2024

(51) Int. Cl.
*H10D 62/10* (2025.01)
*H10D 30/01* (2025.01)
(Continued)

(52) U.S. Cl.
CPC ......... *H10D 62/102* (2025.01); *H10D 30/015* (2025.01); *H10D 30/475* (2025.01); *H10D 62/8503* (2025.01); *H10D 64/112* (2025.01)

(58) Field of Classification Search
CPC ........ H10D 30/00; H10D 62/00; H10D 64/00; H10D 84/00; H10D 30/015; H10D 30/475;
(Continued)

(56) References Cited

U.S. PATENT DOCUMENTS

| 10,204,791 B1 | 2/2019 | Kudymov et al. |
| 2010/0117146 A1 | 5/2010 | Ikeda et al. |

(Continued)

FOREIGN PATENT DOCUMENTS

| CN | 102856355 A | 1/2013 |
| CN | 110137244 A | 8/2019 |

OTHER PUBLICATIONS

International Search Report and Written Opinion of the corresponding PCT application No. PCT/CN2022/073701 mailed on Oct. 10, 2022.

*Primary Examiner* — Fazli Erdem
(74) *Attorney, Agent, or Firm* — Li & Cai Intellectual Property (USA) Office

(57) ABSTRACT

A semiconductor device having improved leakage current characteristics includes a semiconductor substrate with first and second nitride-based semiconductor layers so as to form a heterojunction therebetween with a two-dimensional electron gas (2DEG) region. A doped III-V nitride-based semiconductor layer is disposed over the second nitride-based semiconductor layer. The doped layer has a substantially inverted trapezoidal cross-sectional shape with a longer inverted trapezoid base as an upper surface of the doped III-V nitride-based semiconductor layer and a width of the cross-sectional shape decreasing as the distance away from the upper surface increases. A gate electrode is disposed on or above the doped III-V semiconductor layer and positioned on or above the longer inverted trapezoid base. At (Continued)

least two source/drain (S/D) electrodes are disposed over the second nitride-based semiconductor layer.

19 Claims, 6 Drawing Sheets

(51) Int. Cl.
*H10D 30/47* (2025.01)
*H10D 62/85* (2025.01)
*H10D 64/00* (2025.01)

(58) Field of Classification Search
CPC ............... H10D 62/103; H10D 62/343; H10D 62/8503; H10D 64/112
USPC .......................................................... 257/76
See application file for complete search history.

(56) References Cited

U.S. PATENT DOCUMENTS

| | | | |
|---|---|---|---|
| 2017/0358495 A1 | 12/2017 | Jiang | |
| 2020/0312991 A1* | 10/2020 | Then | ..................... H10D 30/477 |
| 2020/0365699 A1 | 11/2020 | Chang et al. | |
| 2020/0381518 A1* | 12/2020 | Otake | ................ H10D 62/8503 |
| 2021/0043743 A1 | 2/2021 | Nogami | |
| 2021/0151592 A1* | 5/2021 | Lee | ................... H01L 21/31111 |

* cited by examiner

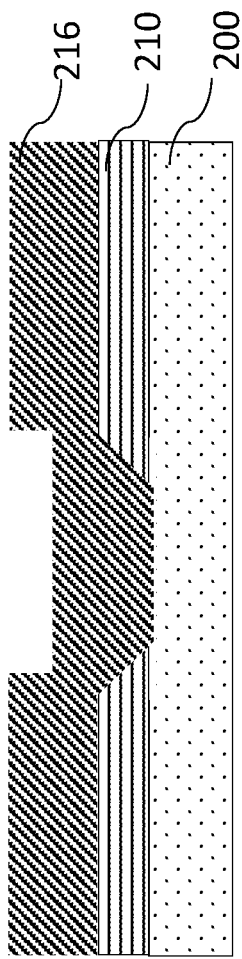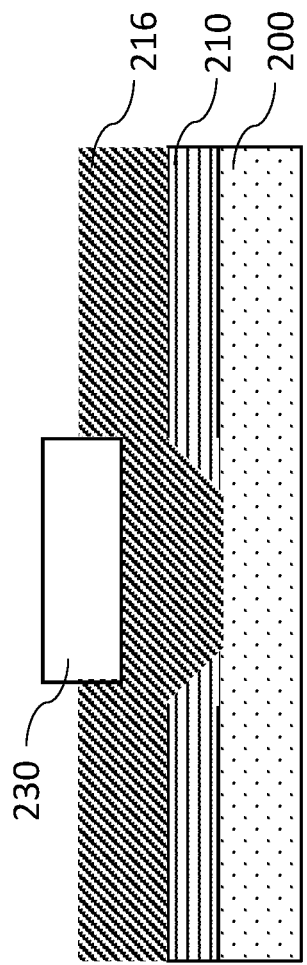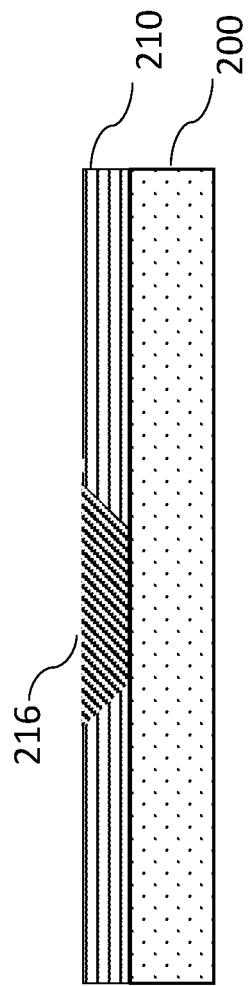

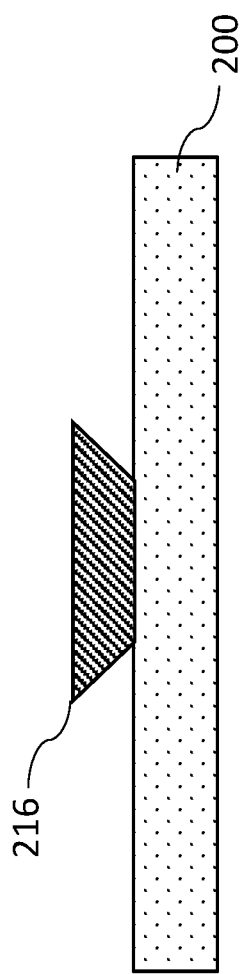
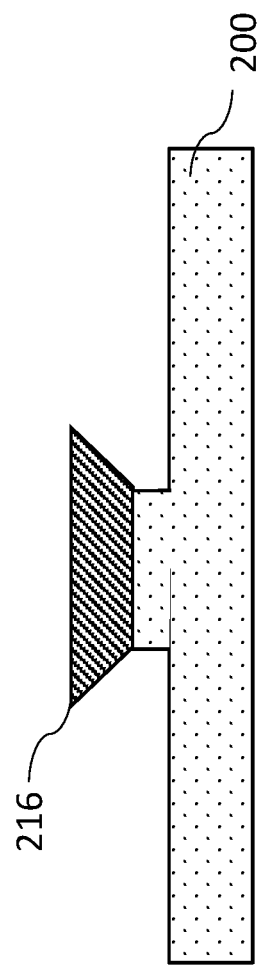

GaN-BASED SEMICONDUCTOR DEVICE WITH REDUCED LEAKAGE CURRENT AND METHOD FOR MANUFACTURING THE SAME

FIELD OF THE INVENTION

The present invention generally relates to semiconductor devices. More specifically, the present invention relates to high electron mobility transistor (HEMT) semiconductor devices with an inverted-trapezoidal shaped doped regions beneath a gate electrode for reducing leakage current.

BACKGROUND OF THE INVENTION

High-electron-mobility transistors (HEMTs) are increasingly employed in high power switching and high frequency applications. The HEMT utilizes a heterojunction interface between two materials, typically GaN-based materials, with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

Enhancement mode HEMTs use a p-doped GaN layer to create a device that is in a normally-off state when the conductive gate is at approximately zero bias. The p-doped III-V compound layer creates a p-n junction with the nitride-based semiconductor layer beneath it to deplete a 2DEG region, such that a zone of the 2DEG region corresponding to a position below the gate structure has different characteristics (e.g., different electron concentrations) than the rest of the 2DEG region and thus is blocked. FIG. 4 depicts the formation of this p-doped III-V layer. A mask layer is formed over a blanked p-GaN layer and a patterned photoresist is used to create a mask pattern. The mask is used to etch the p-GaN layer; however, the barrier layer beneath the layer may be detrimentally etched in this process. Further, the conventional configuration of the p-doped layer in FIG. 4 enables leakage current transmission. Thus, there is a need in the art for GaN-based semiconductor devices with improved leakage current characteristics.

SUMMARY OF THE INVENTION

In accordance with one aspect of the present disclosure, a semiconductor device having improved leakage current characteristics includes a semiconductor substrate with a first nitride-based semiconductor layer disposed over the semiconductor substrate. A second nitride-based semiconductor layer is disposed on the first nitride-based semiconductor layer and having a bandgap greater than a bandgap of the first nitride-based semiconductor layer, so as to form a heterojunction therebetween with a two-dimensional electron gas (2DEG) region.

A doped III-V nitride-based semiconductor layer is disposed over the second nitride-based semiconductor layer. The doped layer has a substantially inverted trapezoidal cross-sectional shape with a longer inverted trapezoid base as an upper surface of the doped III-V nitride-based semiconductor layer and a width of the cross-sectional shape decreasing as the distance away from the upper surface increases.

A gate electrode is disposed on or above the doped III-V semiconductor layer and positioned on or above the longer inverted trapezoid base. At least two source/drain (S/D) electrodes are disposed over the second nitride-based semiconductor layer.

In another aspect, a method for manufacturing a semiconductor device, is provided including forming a first nitride-based semiconductor layer over a semiconductor substrate. A second nitride-based semiconductor layer is formed on the first nitride-based semiconductor layer; the second nitride-based semiconductor layer has a bandgap greater than a bandgap of the first nitride-based semiconductor layer. A dielectric hard mask layer is formed over the second nitride-based semiconductor layer. An opening is created opening in the hard mask layer, the opening having an inverted trapezoid cross-sectional shape. A doped nitride-based semiconductor layer is deposited in the opening in the hard mask layer. The doped nitride-based semiconductor layer is masked in the region over the opening in the hard mask layer. The doped nitride-based semiconductor layer is etched. Two or more source/drain (S/D) electrodes are formed on or over the second nitride-based semiconductor layer. A gate electrode is formed on or over the doped nitride-based semiconductor layer and between the S/D electrodes.

By creating a doped semiconductor layer having the above configuration, a semiconductor device having improved leakage current characteristics is formed.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion. Embodiments of the present disclosure are described in more detail hereinafter with reference to the drawings, in which:

FIGS. 3A-3H depict processes that may be used for form the semiconductor devices of FIG. 1 or 2;

DETAILED DESCRIPTION

Figure 1:
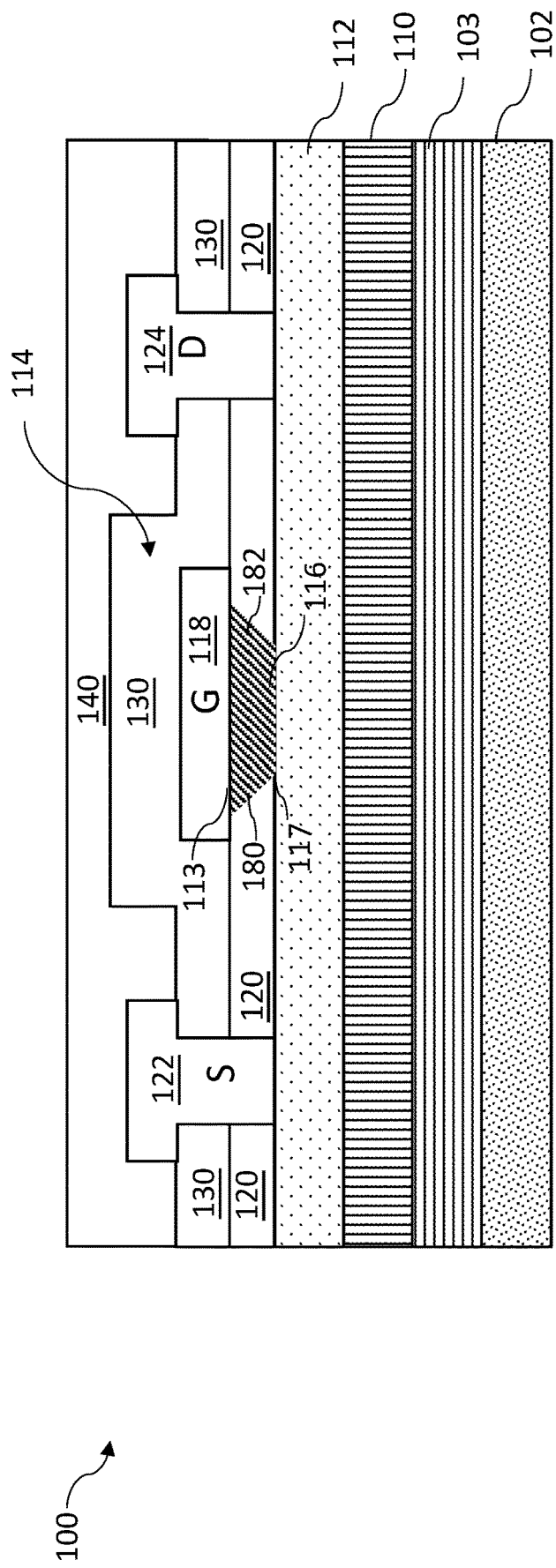
FIG. 1 is a side cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

In the following description, semiconductor devices/semiconductor die, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

In conventional GaN-based HEMT devices, when a positive bias voltage is applied to the gate, a relatively high electrical field may be generated at the edge of a metal gate so as to form a leakage current. The leakage current path includes the distance from an edge where a metal gate contacts a semiconductor gate to the barrier layer. According to some embodiments of the present disclosure, the leakage current is reduced through various geometries selected for the different device components, leading to increased HEMT performance. In one aspect, the electrical field at the edge of the semiconductor gate may be reduced, and/or the leakage current path of the gate may be increased. Therefore, a HEMT device may be obtained with a relatively low leakage current and a relatively high breakdown voltage.

FIG. 1 is a side view of a semiconductor device 100 according to some embodiments of the present disclosure. The semiconductor device 100 may include a semiconductor substrate 102. The exemplary materials of the semiconductor substrate 102 can include, for example but are not limited to, Si, SiGe, SiC, gallium arsenide, p-doped Si, n-doped Si, sapphire, semiconductor on insulator, such as silicon on insulator (SOI), or other suitable semiconductor materials. In some embodiments, the semiconductor substrate 102 can include, for example but are not limited to, group III elements, group IV elements, group V elements, or combinations thereof (e.g., III-V compounds). In other embodiments, the semiconductor substrate 102 can include, for example, one or more other features, such as a doped region, a buried layer, an epitaxy (epi) layer, or combinations thereof.

A first nitride-based semiconductor layer 110 is disposed over the semiconductor substrate 102. The exemplary materials of the nitride-based semiconductor layer 110 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

In some embodiments, the semiconductor device 100 may further includes an optional nucleation and/or buffer layer 103 between the semiconductor substrate 102 and the nitride-based semiconductor layer 110. An exemplary material of the nucleation layer can include, for example but is not limited to AlN. The buffer layer may include nitrides or group III-V compounds, such as GaN, GaAs, InN, AlN, InGaN, AlGaN, InAlGaN, or combinations thereof. The optional buffer layer is provided for reducing lattice and thermal mismatches between the semiconductor substrate 102 and a layer to be formed above the buffer layer (e.g., epitaxially formed thereon), thereby preventing defects due to the mismatches.

The nitride-based semiconductor layer 112 is disposed on the nitride-based semiconductor layer 110. Exemplary materials of the nitride-based semiconductor layer 112 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 110 and 112 are selected such that the nitride-based semiconductor layer 112 has a bandgap (i.e., forbidden band width) greater than a bandgap of the nitride-based semiconductor layer 110, which causes electron affinities thereof different from each other and forms a heterojunction therebetween. For example, when the nitride-based semiconductor layer 110 is an undoped GaN layer having bandgap of approximately 3.4 eV, the nitride-based semiconductor layer 112 may be an AlGaN layer having bandgap of approximately 4.0 eV. As such, the nitride-based semiconductor layers 110 and 112 serve as a channel layer and a barrier layer, respectively. A triangular well potential is generated at an interface between the channel and barrier layers, so that electrons accumulate in the triangular well potential, thereby generating a two-dimensional electron gas (2DEG) region adjacent to the heterojunction.

A gate structure 114 is disposed on the nitride-based semiconductor layer 112. The gate structure 114 is disposed within the central area 104. The gate structure 114 includes a doped III-V compound semiconductor layer 116 and a conductive gate 118. The doped III-V compound layer 116 may be a p-type doped III-V compound semiconductor layer; in some embodiments it may be an n-typed doped III-V compound semiconductor layer. Layer 116 and the conductive gate 118 are stacked on the nitride-based semiconductor layer 112. The doped III-V compound semiconductor layer 116 is between the nitride-based semiconductor layer 112 and the conductive gate 118. In some embodiments, the gate structure 140 may further include a thin dielectric layer (not illustrated) between the doped III-V compound layer 116 and the conductive gate 118.

The semiconductor device 100 is an enhancement mode device, which is in a normally-off state when the conductive gate 118 is at approximately zero bias. Specifically, the doped III-V compound layer 116 creates a p-n junction with the nitride-based semiconductor layer 112 to deplete the 2DEG region, such that a zone of the 2DEG region corresponding to a position below the gate structure 114 has different characteristics (e.g., different electron concentrations) than the rest of the 2DEG region and thus is blocked. Due to such mechanism, the semiconductor device 100 has a normally-off characteristic. In other words, when no voltage is applied to the conductive gate 118 or a voltage applied to the conductive gate 118 is less than a threshold voltage (i.e., a minimum voltage required to form an inversion layer below the gate structure 114), the zone of the 2DEG region below the gate structure 114 is kept blocked, and thus no current flows therethrough. Moreover, by providing the doped III-V compound semiconductor layer 116, gate leakage current is reduced and an increase in the threshold voltage during the off-state is achieved.

The exemplary materials of the doped III-V compound layer 116 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd during layer deposition. In some embodiments, the nitride-based semiconductor layer 110 includes undoped GaN and the nitride-based semiconductor layer 112 includes AlGaN, and the p-type doped III-V compound layer 116 is a p-type GaN layer which can bend the underlying band structure upwards and to deplete the corresponding zone of the 2DEG region so as to place the semiconductor device 100 into an off-state condition.

In some embodiments, the conductive gate 118 may include metals or metal compounds. The exemplary materials of the metals or metal compounds can include, for example but are not limited to, W, Au, Pd, Ti, Ta, Co, Ni, Pt, Mo, TiN, TaN, metal alloys thereof, or other metallic compounds. In some embodiments, the exemplary materials of the conductive gate 118 may include, for example but are not limited to, nitrides, oxides, silicides, doped semiconductors, or combinations thereof. In some embodiments, the optional dielectric layer can be formed by a single layer or more layers of dielectric materials. The exemplary dielectric materials can include, for example but are not limited to, one or more oxide layers, a $SiO_x$ layer, a $SiN_x$ layer, a high-k dielectric material (e.g., $HfO_2$, $Al_2O_3$, $TiO_2$, HfZrO, $Ta_2O_3$, $HfSiO_4$, $ZrO_2$, $ZrSiO_2$, etc.), or combinations thereof.

The shape of the doped III-V semiconductor layer 116 reduces the leakage current from the gate electrode region 114 by creating a longer path for the leakage current and also by reducing the electric field in the gate region. In the embodiment of FIG. 1, the shape of the doped III-V semiconductor layer 116 is an approximately inverted trapezoid shape in cross-section. A trapezoid, as used herein, means a convex quadrilateral with at least one pair of parallel sides. By "approximately inverted trapezoid shape" it is meant that the two parallel sides of the trapezoid do not need to be exactly parallel, that is, the top surface 113 and the bottom surface 117 can be non-parallel by an amount of 20 percent or less, including all intermediate values down to zero where surfaces 113 and 117 are exactly parallel. Similar, angled sidewalls 180 and 182 do not need to have identical angular intersections with the top and the bottom—they can be the same or different in terms of length and angular intersection with the top and bottom surfaces.

The top surface 113 of doped layer 116 may be approximately the same length as the metal portion 118 of the gate or it may be longer or shorter than the width of the metal gate portion 118. The selection of a particular length is based on the desired electrical field to be formed by the gate electrode and, in part, depends on the selected shape of the metal portion 118 of the gate electrode.

An insulating/dielectric layer 120 is disposed over the nitride-based semiconductor layer 112. The insulating layer 120 may be a passivation layer Exemplary materials of the passivation layer 120 can include, for example but are not limited to, $SiN_x$, $SiO_x$, SiON, SiC, SiBN, SiCBN, oxides, nitrides, or combinations thereof. In some embodiments, the passivation layer 120 is a multi-layered structure, such as a composite dielectric layer of $Al_2O_3$/SiN, $Al_2O_3$/$SiO_2$, AlN/SiN, AlN/$SiO_2$, or combinations thereof. In one aspect, the passivation layer may made from a hard mask material used to create the doped layer 116, to be discussed in further detail below in connection with the method of making the device.

A second insulating/dielectric layer 130 is disposed over the insulating/passivation layer 120 and can include $SiN_x$, $SiO_x$, SION, SiC, SiBN, SiCBN, oxides, nitrides, or combinations thereof. In some embodiments, layer 130 may be a multi-layered structure, such as a composite dielectric layer of $Al_2O_3$/SiN, $Al_2O_3$/$SiO_2$, AlN/SiN, AlN/$SiO_2$, or combinations thereof. Layer 130 may be conformal to the date structure 114 and protect the gate from further packaging or insulating layers.

The S/D electrodes 122 and 124 are disposed on the nitride-based semiconductor layer 112. The S/D electrodes may contact the surface of layer 112, or may extend into a portion of the layer 112. In some optional embodiments, the source and drain electrodes may extend to semiconductor layer 110. The S/D electrodes 122 and 124 are located at two opposite sides of the gate structure 114 (i.e., the gate structure 114 is located between the S/D electrodes 122 and 124). The gate structure 114 and the S/D electrodes 122 and 124 can collectively act as a GaN-based HEMT with the 2DEG region 113.

The S/D electrodes 122 and 124 may have bottom portions penetrating the insulating/passivation layer 120 to form interfaces with the nitride-based semiconductor layer 112. The S/D electrodes 122 and 124 optionally have top portions wider than the bottom portions thereof. The top portions of the S/D electrodes 122 and 124 extend over portions of the insulating layer 130.

In the exemplary illustration of FIG. 1B, the left and right S/D electrodes 122 and 124 serve as source and drain electrodes, respectively. The S/D electrodes 122 and 124 may be optionally asymmetrical about the gate structure 114. The left S/D electrode 122 is closer to the gate structure 114 than the right S/D electrode 124. The present disclosure is not limited thereto, and the configuration of the S/D electrodes 122 and 124 is adjustable.

In some embodiment, each of the S/D electrodes 122 and 124 includes one or more conformal conductive layers. In some embodiments, the S/D electrodes 122 and 124 can include, for example but are not limited to, metals, alloys, doped semiconductor materials (such as doped polycrystalline silicon), other conductor materials, or combinations thereof. The exemplary materials of the S/D electrodes 122 and 124 can include, for example but are not limited to, Ti, AlSi, TiN, or combinations thereof. In some embodiments, each of the S/D electrodes 122 and 124 forms ohmic contact with the nitride-based semiconductor layer 112. The ohmic contact can be achieved by applying Ti, Al, or other suitable materials for the S/D electrodes 122 and 124. In some embodiments, a dielectric layer (not illustrated), such as SiN, can be disposed between the nitride-based semiconductor layer 112 and the S/D electrodes 122 and 124.

The passivation structure 140 is disposed above the passivation layer 120 and the S/D electrodes 122 and 124. The passivation structure 140 may be a single layer or a multilayer structure that covers the S/D electrodes 122 and 124. The passivation layer 140 forms interfaces with sidewalls and top surfaces of the S/D electrodes 122 and 124. The passivation layer 140 may have a flat topmost surface, which is able to act as a flat base for carrying layers formed in a step subsequent to the formation of the passivation layer. The exemplary materials of the passivation layer 140 or any sublayers can include, for example but are not limited to, $SiN_x$, $SiO_x$, SiON, SiC, SiBN, SiCBN, oxides, nitrides, or combinations thereof. In some embodiments, the passivation layer 140 is a multi-layered structure, such as a composite dielectric layer of $Al_2O_3$/SiN, $Al_2O_3$/$SiO_2$, AlN/SiN, AlN/$SiO_2$, or combinations thereof. In some embodiments, the passivation layer 140 is thicker than either the passivation 120 or the nitride-based semiconductor layer 112.

Although not shown in FIG. 1, vias may at least penetrate the passivation layer 140 to connect to the S/D electrodes 122 and 124. At least one of the vias further penetrates the passivation layer 140 to form an interface with the metal layer of the conductive gate 118. The exemplary materials of the vias can include, for example but are not limited to, Cu, Al, or combinations thereof.

Additional metal lines over the gate structure 114 and the S/D electrodes 122 and 124 (not shown) may be formed for the purpose of implementing interconnects between circuits.

The metal lines may be in contact with the vias, respectively, such that the gate structure 114 and the S/D electrodes 122 and 124 can be arranged into a circuit. For example, the GaN-based HEMT can be electrically connected to other component(s) via the metal lines of the patterned conductive layer. The patterned conductive layer may include pads or traces for the same purpose.

Figure 2:
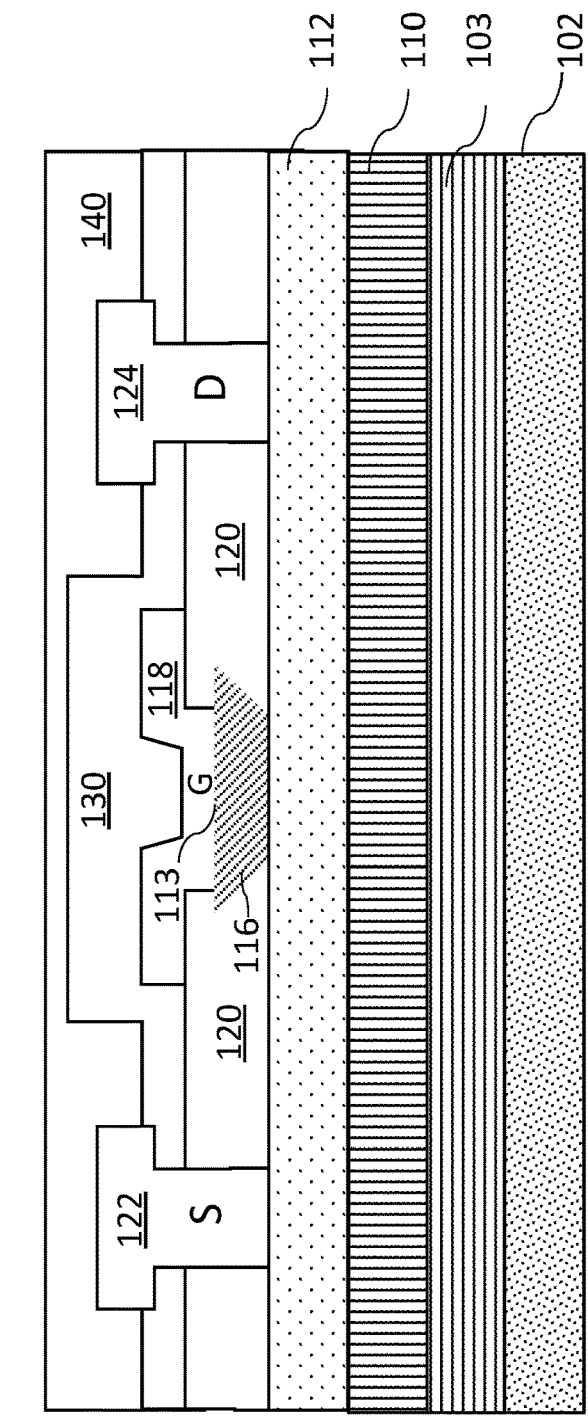
FIG. 2 is a side cross-sectional view of a semiconductor device according to some embodiments of the present disclosure.

FIG. 2 depicts an alternate embodiment 100' of the semiconductor device 100 of FIG. 1. In FIG. 2, the various components have the same composition and same numbering as FIG. 1. Metal gate portion 118 include side portions that extend over the insulating/dielectric layer 120. The top 113 of doped III-V semiconductor layer extends beyond the width of the base of metal gate portion 118 but, in this embodiment, is less that the full width of the top portion of the metal gate portion 118. However, in some embodiments, it may extend to the same width as the top portion of gate 118 or, alternatively, may be wider than the top portion of gate 118. In the embodiment shown, the leakage current path is extended compared to the embodiment of FIG. 1.

Figure 3A:
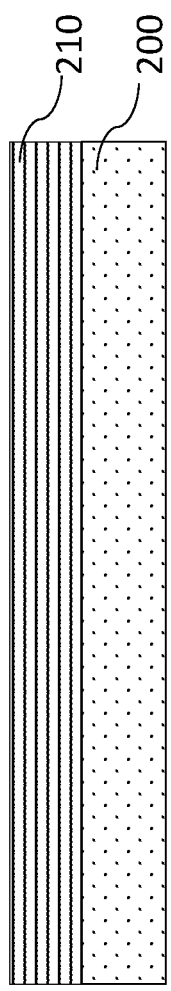
Figure 3B:
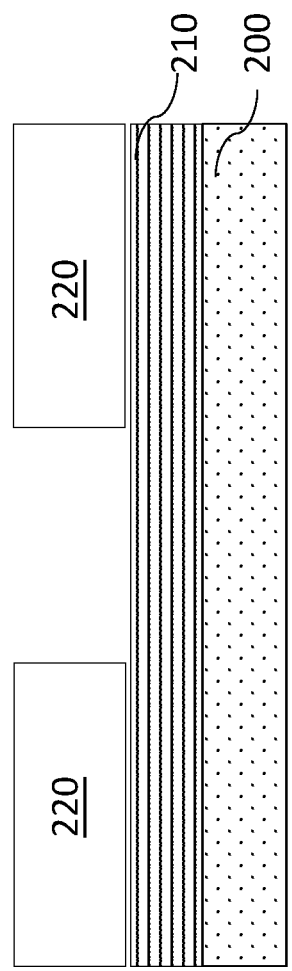
Figure 3C:
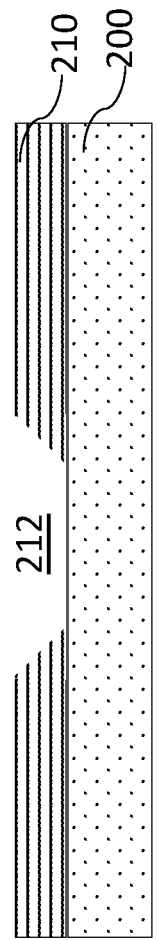
Figure 4:
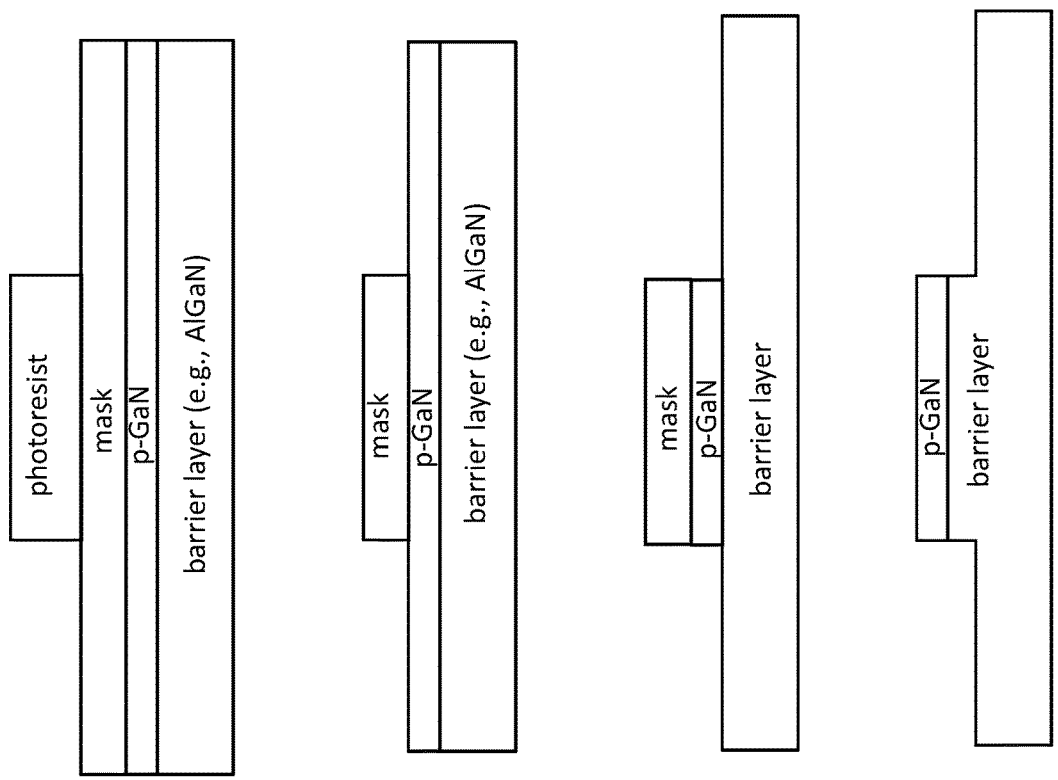
FIG. 4 (related art) shows a related art technique for forming a p-doped GaN layer.

A method for manufacturing the semiconductor device 100 is provided as shown in FIGS. 3A-3H. FIG. 3A is side view of a structure including layers, 102 (substrate), 103 (optional nucleation and/or buffer layer), 110 (first semiconductor layer), and 112 (second semiconductor layer), labeled in FIG. 3A as element 200. In some embodiments, the nitride-based semiconductor layers 110 and 112 can be formed by using deposition techniques. The deposition techniques can include, for example but are not limited to, atomic layer deposition (ALD), physical vapor deposition (PVD), chemical vapor deposition (CVD), metal organic CVD (MOCVD), plasma-enhanced CVD (PECVD), epitaxial growth, or other suitable processes.

A hard mask layer 210 is provided over structure 200 in FIG. 3A. Hard mask 220 may be selected from a variety of materials including, but not limited to silicon oxide, silicon nitride, silicon oxynitride, silicon carbide, aluminum oxide, aluminum nitride, titanium oxide, titanium nitride, tantalum oxide, tantalum nitride, SiBN, SiCBN, oxides, nitrides, or combinations thereof. In some embodiments, the hard mask layer 210 is a multi-layered structure, such as a composite dielectric layer of $Al_2O_3$/silicon nitride, $Al_2O_3$/$SiO_2$, AlN/silicon nitride, AlN/$SiO_2$, or combinations thereof. Other hard insulator/dielectric materials that can be formed through etching and are compatible with nitride-based semiconductors may also be used. The hard mask layer may be deposited by atomic layer deposition (ALD), physical vapor deposition (PVD), chemical vapor deposition (CVD), plasma-enhanced chemical vapor deposition (PECVD) metal organic CVD (MOCVD), or other suitable processes such as spin-on glass processes.

In FIG. 2B, a patterned resist layer 220 is formed over hard mask layer 210. The patterned resist layer 220 may be deposited in a pattern or may be deposited as a complete layer and subject to a photolithography process such as blanket deposition, exposure through a mask pattern to radiation, development to create the desired pattern to create the structure shown in FIG. 2B Using the patterned resist layer 220, the hard mask layer 210 has a portion removed to create void 212 in FIG. 3C. Void 212 may be created by etching using a liquid acid-based etch or a dry etching process such as a plasma etching process, reactive ion etching process, or ion milling process using reactive gases such as $C_3F_8$, $C_2F_6$, $CF_4$, $CHF_3$, $NF_3$, $CCl_2F_2$, $SF_6$, depending upon the selected material for the hard mask layer 210. Similarly, the sidewall angle of void 212 (that is, the angle formed between the sidewall and element 200) is determined, in part, by the choice of hard mask material and choice of etchant process and etchant material.

In FIG. 3D, a layer 216 of III-V semiconductor is deposited (corresponding to layer 116 of FIGS. 1 and 2. The III-V semiconductor material may be a doped layer of III-V semiconductor (for example, by adding a dopant gas). Alternatively, the III-V semiconductor layer is deposited in an undoped state with the dopant added by a technique such as ion implantation. When layer 216 is a p-doped group III-V nitride semiconductor material, such as p-type GaN, p-type AlGaN, p-type InN, p-type AlInN, p-type InGaN, p-type AlInGaN, or combinations thereof, the p-type dopant may include Be, Mg, Zn, or Cd during layer deposition. Layer deposition may be by atomic layer deposition (ALD), physical vapor deposition (PVD), chemical vapor deposition (CVD), metal organic CVD (MOCVD), plasma-enhanced CVD (PECVD), epitaxial growth, or other suitable processes.

In FIG. 3E, a patterned photoresist 230 is formed on the doped III-V layer 216. Etching of layer 216 is performed by a liquid acid-based etch or a dry etching process such as a plasma etching process, reactive ion etching process, or ion milling process using reactive gases such as $C_3F_8$, $C_2F_6$, $CF_4$, $CHF_3$, $NF_3$, $CCl_2F_2$, $SF_6$, or other suitable reactants depending upon the composition of layer 216. The etching may continue until the upper surface of layer 216 is coplanar with hard mask layer 210. This may be desirable when the hard mask layer will remain in the final structure as the insulating/dielectric layer 120. Alternatively, hard mask layer 210 may be removed via a selective etching process using wet or dry etching. This results in the structure shown in FIG. 3G or, alternatively, if a portion of the underlying layer 200 is removed, the structure shown in FIG. 3H.

As seen in FIGS. 1-2, a gate element 118 is formed above the doped III-V compound layer 116. The gate element may be formed by PVD (e.g., sputtering), CVD, PECVD, e-beam evaporation, MOCVD, or other suitable processes. A series of lithographic processes may be used to pattern the gate 118 including applying a photoresist layer, etch, development, and/or other suitable processes.

The passivation layer 120 may be the hard mask layer 210, described above. Alternatively, when the hard mask layer is removed (FIGS. 3G, 3H) formation of layer 120 can be achieved by using deposition techniques. The deposition techniques can include, for example but are not limited to, ALD, PVD, CVD, PECVD, MOCVD, or other suitable processes. After the formation of layer 120 (or with use of hard mask layer 210), at least an etching process is performed to removing portions of the passivation layer 120, so as to form openings that can serve as S/D regions.

A passivation layer 130 is formed over layer 120 to cover the gate 118 In some embodiments, the passivation layer 130 can be formed by using deposition techniques such as ALD, PVD, CVD, PECVD, sputter, evaporation MOCVD, or other suitable processes.

S/D electrodes 122 and 124 are formed in the S/D regions and partially over the passivation layer 120. Openings are formed in layer 130 aligned to the openings formed in layer 120. In some embodiments, the formation of the S/D electrodes includes forming more than one layer by using deposition techniques and a series of lithographic processes. The deposition techniques can include, for example but are not limited to, ALD, PVD, evaporation, sputtering, CVD, MOCVD, or other suitable processes. The series of lithographic processes include applying a photoresist layer, etch, development, and/or other suitable processes, so as to pattern the formed layers as the S/D electrodes 122 and 124.

A passivation layer 140 is formed on the passivation layer 130 to cover the source and drain electrodes 122 and 124. In some embodiments, the passivation layer 140 can be formed by using deposition techniques. The deposition techniques can include, for example but are not limited to, ALD, PVD, CVD, MOCVD, sputtering, evaporation or other suitable processes.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or5 equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
a substrate;
a first nitride-based semiconductor layer disposed over the substrate;
a second nitride-based semiconductor layer disposed on the first nitride-based semiconductor layer and having a bandgap greater than a bandgap of the first nitride-based semiconductor layer, so as to form a heterojunction therebetween with a two-dimensional electron gas (2DEG) region;
a doped III-V nitride-based semiconductor layer disposed over the second nitride-based semiconductor layer and having a substantially inverted trapezoidal cross-sectional shape that has a first surface close to the second nitride-based semiconductor layer and a second surface away from the second nitride-based semiconductor layer, wherein a length of an orthogonal projection of the first surface on the second nitride-based semiconductor layer is less than a length of an orthogonal projection of the second surface on the second nitride-based semiconductor layer, and a width of the cross-sectional shape decreases as the distance away from the second surface increases;
a gate electrode disposed on or above the doped III-V semiconductor layer and positioned on or above the second surface;
at least two source/drain (S/D) electrodes disposed over the second nitride-based semiconductor layer.

2. The nitride-based semiconductor device of claim 1, further comprising a first dielectric layer positioned above the second nitride-based semiconductor layer and extending to edges of the doped III-V nitride-based semiconductor layer.

3. The nitride-based semiconductor device of claim 2, further comprising a second dielectric layer positioned on or over the first dielectric layer and covering the gate electrode.

4. The nitride-based semiconductor device of claim 3, further comprising a third dielectric layer positioned on or over the second dielectric layer and covering the source and drain electrodes.

5. The nitride-based semiconductor device of claim 1, further comprising one or more field plates.

6. The nitride-based semiconductor device of claim 5, wherein at least one field plate at least partially extends over the gate electrode.

7. The nitride-based semiconductor device of claim 1, wherein the gate electrode comprises one or more of titanium, tantalum, tungsten, aluminum, cobalt, copper, nickel, platinum, lead, molybdenum, titanium nitride, tantalum nitride.

8. The nitride-based semiconductor device of claim 1, wherein the first nitride-based semiconductor layer includes gallium nitride.

9. The nitride-based semiconductor device of claim 1, wherein the second nitride-based semiconductor layer includes aluminum gallium nitride.

10. A method for manufacturing a nitride-based semiconductor device, comprising:
forming a first nitride-based semiconductor layer over a substrate;
forming a second nitride-based semiconductor layer on the first nitride-based semiconductor layer, wherein the second nitride-based semiconductor layer has a bandgap greater than a bandgap of the first nitride-based semiconductor layer;
forming a dielectric hard mask layer over the second nitride-based semiconductor layer;
creating an opening in the hard mask layer, the opening having an inverted trapezoid cross-sectional shape;
depositing a doped nitride-based semiconductor material layer in the opening in the hard mask layer;
masking the doped nitride-based semiconductor material layer in the region over the opening in the hard mask layer;
etching the doped nitride-based semiconductor material layer to form a doped nitride-based semiconductor layer, wherein the doped nitride-based semiconductor layer has a substantially inverted trapezoidal cross-sectional shape that has a first surface close to the second nitride-based semiconductor layer and a second surface away from the second nitride-based semiconductor layer, a length of an orthogonal projection of the first surface on the second nitride-based semiconductor layer is less than a length of an orthogonal projection of the second surface on the second nitride-based semiconductor layer, and a width of the cross-sectional shape decreases as the distance away from the second surface increases;
forming two or more source/drain (S/D) electrodes on or over the second nitride-based semiconductor layer; and
forming a gate electrode on or over the doped nitride-based semiconductor layer, positioned on or above the second surface, and between the S/D electrodes.

11. The method of claim 10, wherein the gate electrode comprises a first part in contact with the second surface, and a second part connected to the first part and separated from the second surface, and the second part extends from the first part beyond the second surface.

12. The method of claim 11, further comprising depositing a dielectric layer positioned on or over the hard mask layer and covering the gate electrode.

13. The method of claim 12, further comprising depositing a second dielectric layer positioned on or over the first dielectric layer and covering the source and drain electrodes.

14. The method of claim 11, further comprising forming one or more field plates.

15. The method of claim 14, wherein at least one field plate at least partially extends over the gate electrode.

16. The method of claim 11, wherein the gate electrode comprises one or more of titanium, tantalum, tungsten, aluminum, cobalt, copper, nickel, platinum, lead, molybdenum, titanium nitride, tantalum nitride.

17. The method of claim 11, wherein the first nitride-based semiconductor layer includes gallium nitride.

18. The method of claim 11, wherein the second nitride-based semiconductor layer includes aluminum gallium nitride.

19. The nitride-based semiconductor device of claim 1, wherein the gate electrode comprises a first part in contact with the second surface, and a second part connected to the first part and separated from the second surface, and the second part extends from the first part beyond the second surface.

* * * * *